(12) United States Patent
Kong et al.

(10) Patent No.: US 11,251,407 B2
(45) Date of Patent: Feb. 15, 2022

(54) DISPLAY PANEL HAVING AN OPTICAL COUPLING LAYER AND MANUFACTURING METHOD THEREOF ELECTROLUMINESCENT DEVICE AND DISPLAY DEVICE

(71) Applicant: BOE TECHNOLOGY GROUP CO., LTD., Beijing (CN)

(72) Inventors: Chao Kong, Beijing (CN); Kening Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 497 days.

(21) Appl. No.: 16/313,218

(22) PCT Filed: Jun. 8, 2018

(86) PCT No.: PCT/CN2018/090438
§ 371 (c)(1),
(2) Date: Dec. 26, 2018

(87) PCT Pub. No.: WO2019/037516
PCT Pub. Date: Feb. 28, 2019

(65) Prior Publication Data
US 2021/0226170 A1    Jul. 22, 2021

(30) Foreign Application Priority Data

Aug. 25, 2017  (CN) .......................... 201710744039.8

(51) Int. Cl.
*H01L 27/15*    (2006.01)
*H01L 51/52*    (2006.01)
(Continued)

(52) U.S. Cl.
CPC ...... *H01L 51/5275* (2013.01); *H01L 27/3258* (2013.01); *H01L 51/5234* (2013.01); *H01L 51/56* (2013.01)

(58) Field of Classification Search
CPC ............ H01L 51/5275; H01L 51/5234; H01L 27/3258
See application file for complete search history.

(56) References Cited

U.S. PATENT DOCUMENTS

2008/0252204 A1    10/2008   Yoshida et al.
2010/0159792 A1    6/2010    Visser et al.
(Continued)

FOREIGN PATENT DOCUMENTS

CN    1964095 A      5/2007
CN    103633256 A    3/2014
(Continued)

OTHER PUBLICATIONS

Indian Office Action in Indian Application No. 201917000193, dated Aug. 7, 2020.
(Continued)

*Primary Examiner* — Phuc T Dang
(74) *Attorney, Agent, or Firm* — Collard & Roe, P.C.

(57) ABSTRACT

A display panel and a manufacturing method thereof, an electroluminescent device, and a display device are disclosed. The display panel includes: a base substrate; a plurality of electroluminescent elements on the base substrate, each of the plurality of electroluminescent elements including a light emitting layer and a transparent electrode layer on a light exit side of the light emitting layer; and a first optical coupling layer on a side of the plurality of electroluminescent elements where the transparent electrode layer is
(Continued)

located, and being coupled to at least a part of the transparent electrode layer. The first optical coupling layer is conductive.

18 Claims, 5 Drawing Sheets

(51) Int. Cl.
*H01L 27/32* (2006.01)
*H01L 51/56* (2006.01)

(56) References Cited

U.S. PATENT DOCUMENTS

| | | | |
|---|---|---|---|
| 2014/0191202 A1 | 7/2014 | Shim et al. | |
| 2015/0228931 A1* | 8/2015 | Lamansky | H01L 51/5275 257/40 |
| 2015/0325814 A1* | 11/2015 | Yang | H01L 51/5215 257/40 |
| 2015/0372257 A1 | 12/2015 | Zhang | |
| 2016/0126489 A1 | 5/2016 | Yokota et al. | |
| 2016/0197311 A1* | 7/2016 | Lamansky | B82Y 20/00 257/40 |
| 2016/0260925 A1* | 9/2016 | Hou | H01L 51/525 |
| 2017/0222149 A1* | 8/2017 | Nakadaira | H01L 27/3276 |
| 2017/0309833 A1* | 10/2017 | Lei | H01L 51/0072 |

FOREIGN PATENT DOCUMENTS

| | | |
|---|---|---|
| CN | 103715372 A | 4/2014 |
| CN | 104904030 A | 9/2015 |
| CN | 105702876 A | 6/2016 |
| CN | 103219476 B | 8/2016 |
| WO | 2006/104256 A1 | 10/2006 |
| WO | 2015/001785 A1 | 1/2015 |

OTHER PUBLICATIONS

International Search Report of PCT/CN2018/090438 in Chinese, dated Aug. 23, 2018 with English translation.
Notice of Transmittal of the International Search Report of PCT/CN2018/090438 in Chinese, dated Aug. 29, 2018.
Written Opinion of the International Searching Authority of PCT/CN2018/090438 in Chinese, dated Aug. 29, 2018 with English translation.
English translation of Extended European Search Report in EP Application No. 18825557.4 dated Mar. 17, 2021.

* cited by examiner

DISPLAY PANEL HAVING AN OPTICAL COUPLING LAYER AND MANUFACTURING METHOD THEREOF ELECTROLUMINESCENT DEVICE AND DISPLAY DEVICE

CROSS REFERENCE

This application is the National Stage of PCT/CN2018/090438 filed on Jun. 8, 2018, which claims priority under 35 U.S.C. § 119 of Chinese Application No. 201710744039.8 filed on Aug. 25, 2017, the disclosure of which is incorporated by reference.

TECHNICAL FIELD

At least one embodiment of the present disclosure relates to a display panel, a manufacturing method thereof, an electroluminescent device, and a display device.

BACKGROUND

At present, organic light emitting diode (OLED) is increasingly used in the fields of illumination and display. Unlike traditional cathode ray tube display (CRT), plasma display (PDP), and liquid crystal display (LCD), etc., OLED display has the characteristics such as self-illumination, flexibility, wide viewing angle, fast response speed, ultra-thin, high luminous efficiency, low power consumption, and wide operating temperature, and thus is considered as a promising next-generation display.

SUMMARY

At least one embodiment of the present disclosure provides a display panel including: a base substrate; a plurality of electroluminescent elements on the base substrate, each of the plurality of electroluminescent elements comprising a transparent electrode layer at its light exit side; and a first optical coupling layer on a side of the plurality of electroluminescent elements where the transparent electrode layer is located, and being in contact with at least a part of the transparent electrode layer. The first optical coupling layer is a conductive layer.

For example, the first optical coupling layer is a semiconductor layer including a first n-type doping material or a first p-type doping material.

For example, the transparent electrode layer has a thickness of 90 to 150 Å.

For example, the first optical coupling layer is located on a side of the plurality of electroluminescent elements away from the base substrate.

For example, the plurality of electroluminescent elements are arranged in an array, and the first optical coupling layer is an integral layer covering the plurality of electroluminescent elements.

For example, the display panel further includes: a second optical coupling layer on a side of the first optical coupling layer away from the transparent electrode layer. A refractive index of the second optical coupling layer is smaller than a refractive index of the first optical coupling layer.

For example, the second optical coupling layer is a semiconductor layer including a second n-type doping material or a second p-type doping material, and is in contact with a part of the transparent electrode layer.

For example, the display panel further includes: a second optical coupling layer between the first optical coupling layer and the transparent electrode layer. A refractive index of the second optical coupling layer is greater than a refractive index of the first optical coupling layer.

For example, each of the plurality of electroluminescent elements is an organic electroluminescence element.

At least one embodiment of the present disclosure provides an electroluminescent device, including: a base substrate; a light emitting layer on the base substrate; a transparent electrode layer on a light exit side of the light emitting layer; and an optical coupling layer on a side of the transparent electrode layer away from the light emitting layer, and being in contact with the transparent electrode layer. The optical coupling layer is a conductive layer.

At least one embodiment of the present disclosure provides a manufacturing method of a display panel, including: providing a base substrate; forming a plurality of electroluminescent elements on the base substrate, forming the plurality of electroluminescent elements including: forming a transparent electrode layer on a light exit side of the plurality of electroluminescent elements; and forming a first optical coupling layer on a side of the plurality of electroluminescent elements where the transparent electrode layer is formed, the first optical coupling layer being in contact with at least a part of the transparent electrode layer. The first optical coupling layer is a conductive layer.

For example, forming the first optical coupling layer includes: evaporating a first host material and one of a first n-type doping material and a first p-type doping material on a side of the transparent electrode layer away from the plurality of electroluminescent elements to form the first optical coupling layer.

For example, the first optical coupling layer is formed on a side of the plurality of electroluminescent elements away from the base substrate.

For example, before forming the first coupling layer, the manufacturing method further includes: forming a second optical coupling layer on a side of the transparent electrode layer away from the plurality of electroluminescent elements. A refractive index of the second optical coupling layer is smaller than a refractive index of the first optical coupling layer.

For example, forming the second optical coupling layer includes: evaporating a second host material and one of a second n-type doping material and a second p-type doping material on a side of the first optical coupling layer away from the transparent electrode layer to form the second optical coupling layer. The second optical coupling layer is in contact with a part of the transparent electrode layer.

For example, the manufacturing method of the display panel further includes: forming a second optical coupling layer between the first optical coupling layer and the transparent electrode layer. A refractive index of the second optical coupling layer is greater than a refractive index of the first optical coupling layer.

At least one embodiment of the present disclosure provides a display device, including the display panel provided by any one of abovementioned embodiments.

BRIEF DESCRIPTION OF THE DRAWINGS

In order to clearly illustrate the technical solution of embodiments of the present disclosure, the drawings of the embodiments or related technical description will be briefly described in the following; it is obvious that the drawings in the description are only related to some embodiments of the present disclosure and not limited to the present disclosure.

DETAILED DESCRIPTION

Figure 1A:
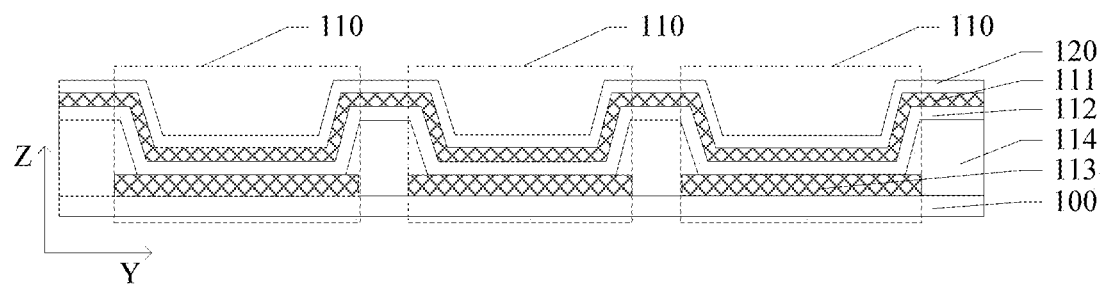
FIG. 1A is a partial sectional view of a display panel provided by an example of an embodiment of the present disclosure.

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "On," "under," "left," "right," etc., are only used to indicate relative position relationship, and when the position of the object which is described is changed, the relative position relationship may be changed accordingly.

An external quantum efficiency of an organic light emitting diode (OLED) device is a ratio of a number of photons emitted by the OLED device to a number of injected electron-hole pairs. At present, efforts to obtain high quantum efficiency have not stopped. A phosphorescent material with a quantum efficiency of 100% has been widely used in OLED illumination and display devices. However, because of the effects of refraction, reflection and absorption among layers in the OLED device, only 20% of the light emitted by the OLED device can be emitted out from the device, and about 80% of the remaining light will be limited or consumed inside the OLED device.

In the study, the inventor(s) of the present application has found that the microcavity structure in a general top emitting OLED device can effectively increase light output, so as to largely increase efficiency of the OLED. The top emitting OLED generally adopts a structure having a transparent cathode matched with an optical coupling layer (CPL), i.e., a structure using the transparent cathode to match the optical coupling layer to increase the light output. In order to guarantee light transmittance of the transparent cathode, the cathode cannot be evaporated too thick. However, a relatively thin cathode increases a series resistance of the device, resulting in a large IR-drop, reducing uniformity of the display panel in the device, affecting the display effect, and even causing anomalies at a lapping position of the cathode and a pixel definition layer (PDL).

In order to prevent the adverse effects caused by a cathode which is too thin, the thickness of the cathode is usually increased to guarantee the stability of performance. However, if the thickness of the cathode is too thick, transmittance and color shift of the device will be affected, in other words, under normal conditions, the cathode is too thick to cause excessive color shift.

Embodiments of the present disclosure provide a display panel, a manufacturing method thereof, an electroluminescent device, and a display device. The display panel includes: a base substrate; a plurality of electroluminescent elements on the base substrate, each of the plurality of electroluminescent elements including a transparent electrode layer at its light exit side; and a first optical coupling layer on a side of the plurality of electroluminescent elements where the transparent electrode layer is located. The first optical coupling layer is in contact with at least a part of the transparent electrode layer, and the first optical coupling layer is a conductive layer. The display panel provided by the embodiments of the present disclosure includes the first optical coupling layer having relatively good conductive characteristics, which can assist the transparent electrode layer in conducting electricity, so as to reduce the thickness of the transparent electrode layer, reduce the IR-drop of the display panel, and increase uniformity of the device.

Hereinafter, the display panel, the manufacturing method thereof, the electroluminescent device, and the display device provided by the embodiments of the present disclosure are described below with reference to the accompanying drawings.

Figure 1B:
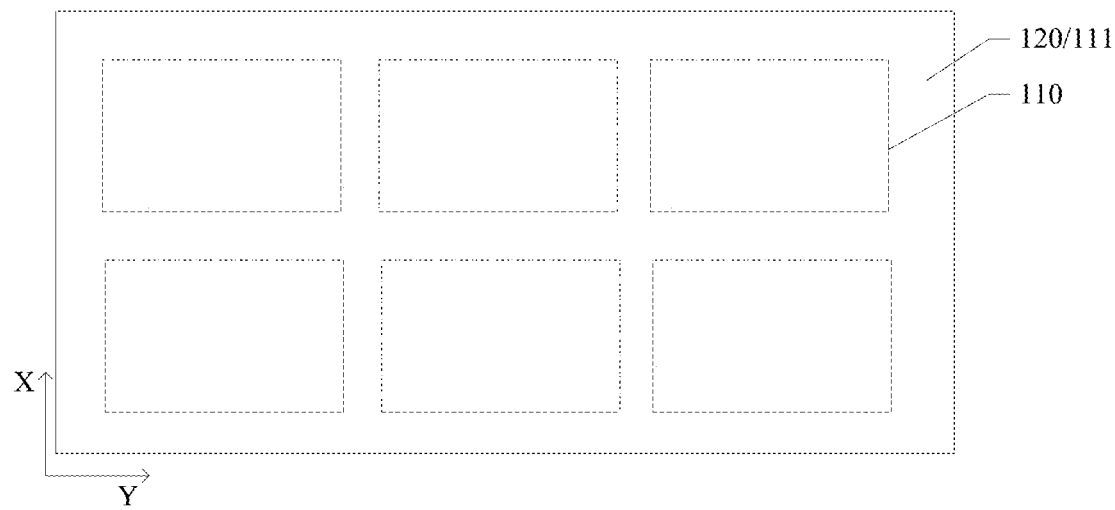
FIG. 1B is a partial planar structure view of the display panel illustrated by FIG. 1A.

An embodiment of the present disclosure provides a display panel. FIG. 1A is a partial sectional view of a display panel provided by an example of an embodiment of the present disclosure, and FIG. 1B is a partial planar structure view of the display panel illustrated by FIG. 1A. As illustrated by FIG. 1A, the display panel provided by the present example includes a base substrate 100, an electroluminescent element 110, and a first optical coupling layer 120. A plurality of electroluminescent elements 110 are located on the base substrate 100. Each of the plurality of electroluminescent elements 110 includes a transparent electrode layer 111 at its light exit side, that is, light emitted from the electroluminescent element 110 passes through and exits from the transparent electrode layer 111. The first optical coupling layer 120 is disposed on a side of the electroluminescent element 110 where the transparent electrode layer 111 is located, that is, light emitted from the transparent electrode layer 111 continues to pass through and exit from the first optical coupling layer 120. The first optical coupling layer 120 is in contact with at least a part of the transparent electrode layer 111, and the first optical coupling layer 120 is a conductive layer.

For example, a material of the transparent electrode layer 111 may include one or more selected from the group consisting of Ag (silver), Al (aluminum), Mg:Ag (magnesium silver alloy), Mg:Al (magnesium aluminum alloy), Au (gold), ITO (indium tin oxide), $SnO_2$ (tin oxide), ZnO (zinc oxide), FTO (fluorine-doped tin oxide), AZO (aluminum-doped zinc oxide), and the like.

For example, the first optical coupling layer 120 plays a role of increasing light output of a general optical coupling layer (CPL). In a case where the transparent electrode layer 111 is made of a metal material, in order to reduce mode loss of SPP (surface plasmon polariton) of the transparent electrode layer 111, and increase transmittance of the transparent electrode layer 111, a refractive index of the first optical coupling layer 120 should be selected to be relatively high, for example, the refractive index of the first optical coupling layer 120 is greater than 1.8, and the present embodiment includes but is not limited thereto.

For example, because reflection of an interface between the first optical coupling layer 120 and air will be strong upon the refractive index of the first optical coupling layer 120 being selected to be relatively high, a transparent buffer layer (not shown) can be provided between the first optical coupling layer 120 and the air. The transparent buffer layer has a refractive index between that of the first optical coupling layer 120 and that of air, which can attenuate the reflection, so as to increase the light output.

For example, the inventor(s) of the present application has considered that the conductivity of a semiconductor film can be improved by doping the semiconductor film with a material having high conductivity. For example, it has been applied in an electron transport layer and a hole transport layer of an OLED device. For example, a hole transport layer or a hole injection layer employing a p-type doping can reduce a driving voltage of the panel. Therefore, the display panel provided by the embodiment of the present disclosure may perform a p-type doping or n-type doping to the optical coupling layer (the material of the optical coupling layer is a semiconductor material), so as to increase conductive characteristics of the optical coupling layer.

For example, the first optical coupling layer 120 is a semiconductor layer including a first n-type doping material or a first p-type doping material. Conductivity of a semiconductor host material can be increased by a doping process, thus, the first optical coupling layer provided by the present embodiment has relatively good conductive characteristics, while having an effect of increasing the light output, which can assist the transparent electrode layer in conducting electricity, so as to reduce IR-drop of the display panel and increase uniformity of the device.

For example, the first optical coupling layer 120 provided in the present embodiment has relatively good conductive characteristics and can assist the transparent electrode layer 111 in conducting electricity. Therefore, the transparent electrode layer 111 in the embodiment can have a small thickness, for example, the transparent electrode layer 111 may have a thickness of 90 to 150 Å, so that while the stability of the transparent electrode layer 111 being guaranteed, the transmittance of the transparent electrode layer 111 can be increased, and the color shift can be reduced.

For example, a material of the first optical coupling layer 120 may include any one or more selected from the group consisting of NPB (N,N'-bis(1-naphthyl)-N,N'-diphenyl-1,1'-diphenyl-4,4'-diamine), TPD (N,N'-bis(3-methylphenyl)-N,N'-diphenyl-1,1'-diphenyl-4,4'-diamine) and $Alq_3$ (8-hydroxyquinoline aluminum), that is, the material of the first optical coupling layer 120 may be the same semiconductor material as the hole transport layer or the electron transport layer, and the present embodiment includes but is not limited thereto.

For example, the first optical coupling layer 120 may use NPD (N,N'-diphenyl-N,N'-(1-naphthyl)-1,1'-biphenyl-4,4'-diamine) as a host material, and use HAT-CN (11-hexacyano-1;12-hexaazatriphenylene) as a doping material to perform a p-type doping to NPD to form the first optical coupling layer 120 having relatively good conductive characteristics.

For example, the present embodiment is not limited to doping HAT-CN, and also can use a p-type dopant, such as: F4TCNQ (2,3,5,6-tetrafluoro-7,7',8,8'-tetracyanoquinone-dimethane), $MoO_3$ (molybdenum trioxide), $V_2O_5$ (vanadium pentoxide), and $WO_3$ (tungsten trioxide).

For example, the first optical coupling layer 120 may also use Liq (lithium quinoline) as a host material, and use Cs (caesium) as a doping material to perform n-type doping on the Liq to form the first optical coupling layer 120 having relatively good conductive characteristics. For example, the present embodiment is not limited to doping Cs, and may also use an n-type dopant such as: Li (lithium), $Li_2CO_3$ (lithium carbonate), and $Cs_2CO_3$ (cerium carbonate).

For example, the first optical coupling layer 120 has a thickness of 40-100 nm in a direction perpendicular to the base substrate 100, and the present embodiment includes but is not limited thereto.

For example, as illustrated by FIG. 1A, the transparent electrode layer 111 is located on the light exit side of the electroluminescent element 110, and the emitted light from the electroluminescent element 110 is emitted from the transparent electrode layer 111 on a reverse side thereof without passing through the base substrate 100. The electroluminescent element 110 is a top emitting structure.

For example, the electroluminescent element 110 further includes a light emitting layer 112 and an electrode 113 located on a side of the light emitting layer 112 away from the transparent electrode layer 111.

For example, a material of the electrode 113 may include any one or more selected from the group consisting of ITO/Ag/ITO (indium tin oxide/silver/indium tin oxide), Au (gold), ITO (indium tin oxide), $SnO_2$ (tin oxide), ZnO (zinc oxide), FTO (fluorine-doped tin oxide), AZO (aluminum-doped zinc oxide), and the like. In a case where the electrode 113 is a transparent conductive electrode, a reflective layer may be disposed between the electrode 113 and the base substrate 100 to reflect the light emitted from the electrode 113, so that the light emitted from the electrode 113 can pass through and exit from the first optical coupling layer 120.

For example, the electroluminescent element further includes a hole injection layer and a hole transport layer (not shown) between the light emitting layer 112 and the electrode 113.

For example, the electroluminescent element further includes an electron transport layer (not shown) between the light emitting layer 112 and the transparent electrode layer 111.

For example, a pixel defining layer 114 is disposed between adjacent electroluminescent elements 110. For example, the first optical coupling layer 120 having a good conductivity is provided at a slope of a lapping position of the pixel defining layer 114 and the transparent electrode layer 111, so that IR-drop caused by relatively large resistance of the transparent electrode layer 111 can be reduced.

For example, as illustrated by FIG. 1B, a plurality of electroluminescent elements 110 are arranged in an array in a X direction and a Y direction, and the dashed boxes in the figure indicate the electroluminescent elements 110 arranged in an array. The transparent electrode layer 111 of the plurality of electroluminescent elements 110 is an integral layer, that is, the transparent electrode layer 111 includes portions located in the plurality of electroluminescent elements 110 and portions between the adjacent electroluminescent elements 110. The first optical coupling layer 120 is an integral layer covering the plurality of electroluminescent elements 110, that is, the first optical coupling layer 120 covers the transparent electrode layer 111.

For example, the first optical coupling layer 120 may completely cover the transparent electrode layer 111. The present embodiment is not limited thereto. For example, the first optical coupling layer 120 may also cover a part of the transparent electrode layer 111, in this case, the first optical coupling layer 120 at least covers the transparent electrode layer 111 located in the electroluminescent elements 110.

Figure 1C:
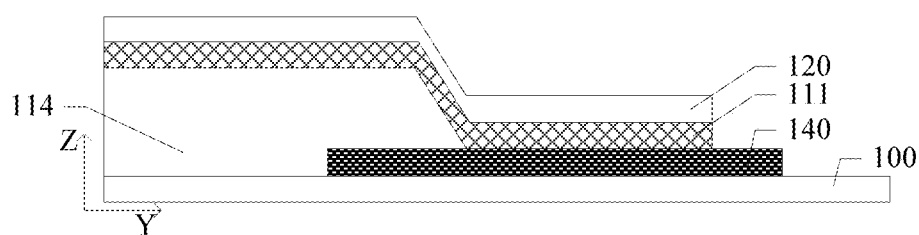
FIG. 1C is a schematic sectional diagram of a part of a display panel provided by an embodiment of the present disclosure, located at an edge of a transparent electrode layer.
Figure 1D:
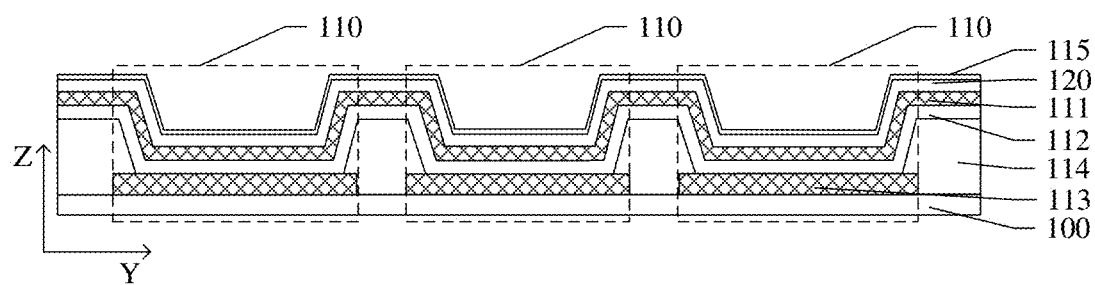
FIG. 1D is a partial sectional view of a display panel provided by an example of an embodiment of the present disclosure.

For example, FIG. 1C is a schematic sectional diagram of a part of a display panel provided by an embodiment of the present disclose, located at an edge of the transparent electrode layer. As illustrated by FIG. 1C, the edge of the transparent electrode layer 111 extending in the Y direction is connected with a power source of the display panel through an electrical connection line 140.

For example, as illustrated by FIG. 1C, the first optical coupling layer 120 may be a film layer having the same size as the transparent electrode layer 111, that is, an orthographic projection of the first optical coupling layer 120 on the base substrate 100 is completely overlapped with an orthographic projection of the transparent electrode layer 111 on the base substrate 100. Therefore, an edge of the first optical coupling layer 120 is flush with an edge of the transparent electrode layer 111 in the direction perpendicular to the base substrate 100 (i.e., a Z direction).

For example, the first optical coupling layer 120 may also be a film layer having a size slightly smaller than that of the transparent electrode layer 111, that is, the orthographic projection of the first optical coupling layer 120 on the base substrate 100 is located within the orthographic projection of the transparent electrode layer 111 on the base substrate 100.

For example, on the basis of guaranteeing that the first optical coupling layer 120 covers the transparent electrode layer 111 in the electroluminescent elements, the orthographic projection of the first optical coupling layer 120 on the base substrate 100 may be located in the middle of the orthographic projection of adjacent ones of the first optical coupling layers 120 on the base substrate 100.

For example, the first optical coupling layer may also be located only in a light emitting region of the electroluminescent element.

Figure 2A:
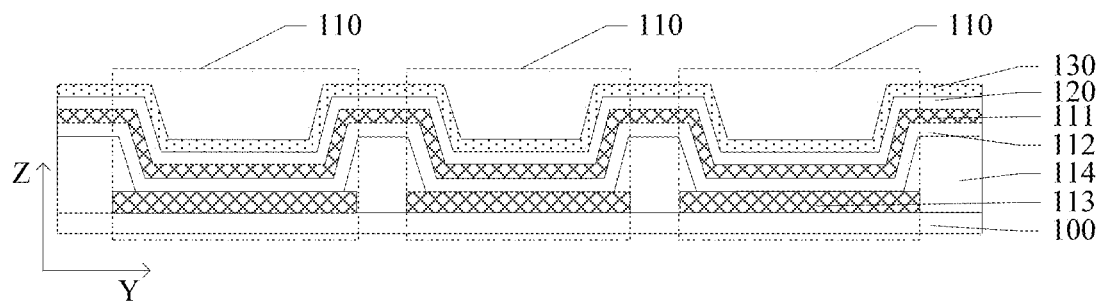
FIG. 2A is a partial sectional view of a display panel provided by another example of an embodiment of the present disclosure.
Figure 2B:
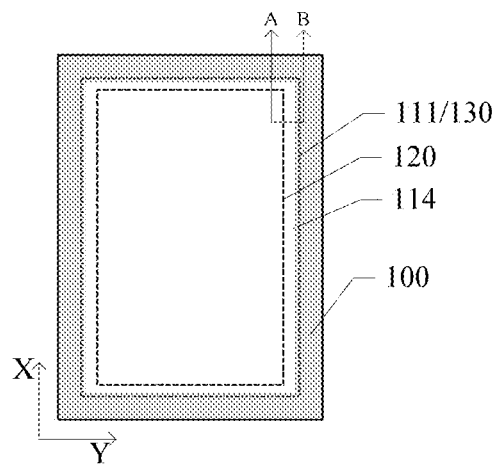
FIG. 2B is a planar view of the display panel illustrated by FIG. 2A.
Figure 2C:
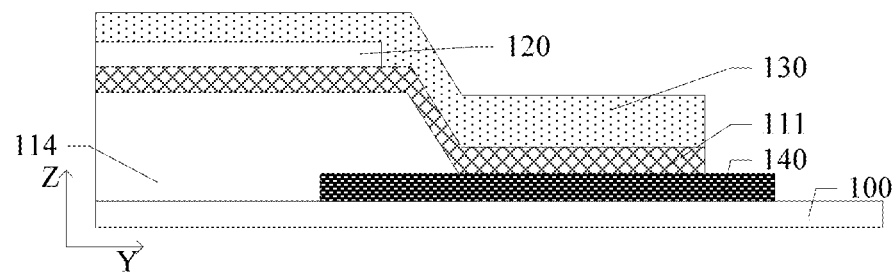
FIG. 2C is a cross-section view of a YZ plane of the display panel along a AB line illustrated by FIG. 2B.

For example, FIG. 2A is a partial sectional view of a display panel provided by another example of an embodiment of the present disclosure, FIG. 2B is a planar view of the display panel illustrated by FIG. 2A, and FIG. 2C is a cross-section view of a YZ plane of the display panel along a AB line illustrated by FIG. 2B. As illustrated by FIG. 2A, the display panel further includes: a second optical coupling layer 130 on a side of the first optical coupling layer 120 away from the transparent electrode layer 111, and a refractive index of the second optical coupling layer 130 is smaller than that of the first optical coupling layer 120.

For example, the first optical coupling layer 120 has a refractive index of $n_1$, $n_1 > 1.8$, and the second optical coupling layer 130 has a refractive index of $n_2$, $1.5 < n_2 < 1.8$. The present embodiment includes but is not limited thereto. In the present embodiment, the light output can be further increased by disposing the first optical coupling layer having a relatively high refractive index on a side close to the transparent electrode layer and disposing the second optical coupling layer having a relatively low refractive index on a side away from the transparent electrode layer. The present embodiment includes but is not limited thereto.

For example, the first optical coupling layer and the second optical coupling layer can be a set of optical coupling layer group, and a side of the second optical coupling layer away from the first optical coupling layer can be provided with at least one set of optical coupling layer group, i.e., a side of the second optical coupling layer away from the first optical coupling layer can be provided with a plurality of optical coupling layers, of which the refractive indexes are in an arrangement that high refractive indexes and low refractive indexes are arranged alternately in a direction from a position close to the second optical coupling layer to a position away from the second optical coupling layer.

For example, a material of the second optical coupling layer 130 may include an organic small molecule material or an inorganic material having a relatively high transmittance.

For example, in an example of the present embodiment, the second optical coupling layer 130 may be a semiconductor material layer including a second n-type doping material or a second p-type doping material, and be in contact with a part of the transparent electrode layer 111. Because the refractive index of the second optical coupling layer 130 is smaller than the refractive index of the first optical coupling layer 120, and the conductivity of the second optical coupling layer 130 after being subjected to a p-type doping or n-type doping is greater than that of the first optical coupling layer 120. Therefore, the second optical coupling layer 130 in the present example can further assist the transparent electrode layer 111 in conducting electricity by partially contacting the transparent electrode layer 111, so as to reduce the IR-drop of the display panel and increase the uniformity of the device.

For example, a total thickness of the first optical coupling layer 120 and the second optical coupling layer 130 in the direction perpendicular to the base substrate 100 is 40-100 nm, and the embodiment includes but is not limited thereto.

In order to clearly illustrate a positional relationship among the first optical coupling layer 120, the second optical coupling layer 130, and the transparent electrode layer 111, FIG. 2B and FIG. 2C only show these layers, and FIG. 2B does not show the electrical connection line 140 in FIG. 2C.

For example, as illustrated by FIGS. 2B and 2C, an orthographic projection of the second optical coupling layer 130 on the base substrate 100 is completely overlapped with the orthographic projection of the transparent electrode layer 111 on the base substrate 100, that is, in the direction perpendicular to the base substrate 100, an edge of the second optical coupling layer 130 is flush with the edge of the transparent electrode layer 111. The orthographic projection of the first optical coupling layer 120 on the base substrate 100 falls into the middle of the orthographic projection of the transparent electrode layer 111 on the base substrate 100, and the first optical coupling layer 120 is located on the electroluminescent element. Therefore, the second optical coupling layer 130 may be in contact with an edge of the transparent electrode layer 111 which is not covered by the first optical coupling layer 120. The present embodiment is not limited thereto. For example, the first optical coupling layer may also be located only in the light emitting region of the electroluminescent element, that is, there are a plurality of first optical coupling layers, and the first optical coupling layers are also arranged in an array, and the second optical coupling layer may also be electrically connected with the transparent electrode layer exposed by a gap between adjacent ones of the first light-coupling layers.

For example, as illustrated by FIG. 2C, the second optical coupling layer 130 located at a slope portion of the pixel defining layer 114 is in contact with the transparent electrode layer 111 to assist the transparent electrode layer 111 in conducting electricity.

Figure 2D:
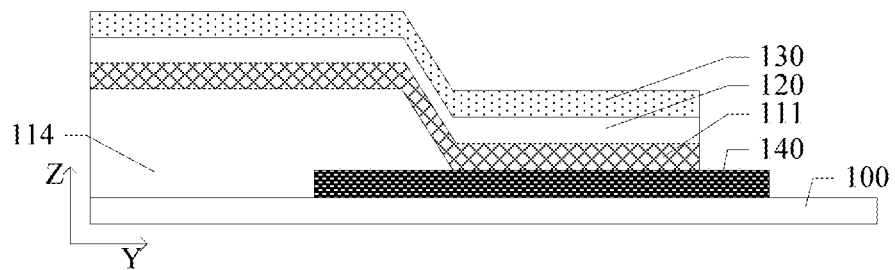
FIG. 2D is a cross-section view of the YZ plane having a same position with FIG. 2C of another example of an embodiment of the present disclosure.

For example, FIG. 2D is a cross-section view of the YZ plane having a same position with FIG. 2C of another example of an embodiment of the present disclosure. As illustrated by FIG. 2D, the second optical coupling layer 130 may also be an optical coupling layer which is not subjected to a p-type doping or n-type doping, and only plays a role of increasing light output, thus, the second optical coupling layer 130 does not need to be in contact with the transparent electrode layer 111.

Figure 2E:
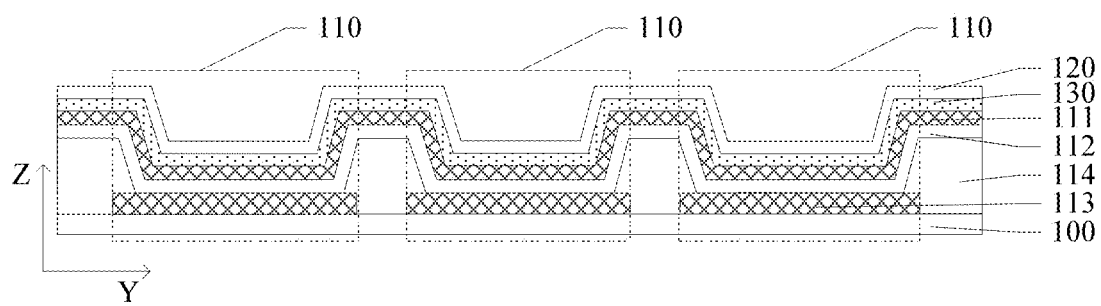
FIG. 2E is a partial sectional view of a display panel provided by another example of an embodiment of the present disclosure.
Figure 2F:
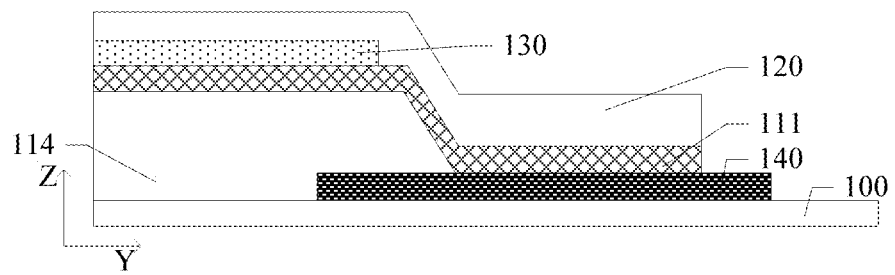
FIG. 2F is a cross-section view of a YZ plane of the display panel along a AB line illustrated by FIG. 2E.

For example, FIG. 2E is a partial sectional view of a display panel provided by another example of an embodiment of the present disclosure; and FIG. 2F is a cross-section view of a YZ plane of the display panel along a AB line illustrated by FIG. 2E. As illustrated by FIG. 2E and FIG. 2F, in another example provided by an embodiment of the present disclosure, the display panel includes a second optical coupling layer 130 between the first optical coupling layer 120 and the transparent electrode layer 111. A refractive index of the second optical coupling layer 130 is greater than the refractive index of the first optical coupling layer 120. Because the first optical coupling layer 120 is in contact with at least a part of the transparent electrode layer 111, and the first optical coupling layer 120 has relatively good conductivity after being subjected to a p-type doping or n-type doping, the first optical coupling layer 120 can assist the transparent electrode layer 111 in conducting electricity, so as to reduce the IR-drop of the display panel and increase the uniformity of the device. The second optical coupling layer in the present example may be a film layer with better conductivity being subjected to a p-type doping or n-type doping, or an optical coupling layer which is not subjected to a p-type doping or n-type doping, and only plays a role of increasing light output, the present example is not limited thereto.

For example, the electroluminescent element provided by the embodiments of the present disclosure is an organic electroluminescence element.

Figure 3A:
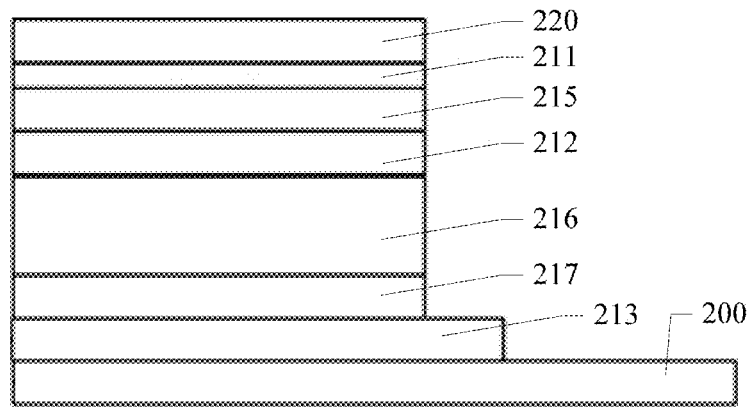
FIG. 3A is a schematic sectional diagram of an electroluminescent device provided by an example of an embodiment of the present disclosure.

Another embodiment of the present disclosure provides an electroluminescent device. FIG. 3A is a schematic sectional diagram of an electroluminescent device provided by an example of an embodiment of the present disclosure. As illustrated by FIG. 3A, the electroluminescent device includes: a base substrate 200, a light emitting layer 212 on the base substrate 200, a transparent electrode layer 211 on a light exit side of the light emitting layer 212, and an optical coupling layer 220 located on a side of the transparent electrode layer 211 away from the light emitting layer 212, and being in contact with at least a part of the transparent electrode layer 211 (which may also be referred to as a first optical coupling layer 220 in the present embodiment), and the optical coupling layer 220 is a conductive layer.

For example, a material of the transparent electrode layer 211 may be a metal material, for example, the metal material includes one or more selected from the group consisting of Ag (silver), Al (aluminum), Mg:Ag (magnesium silver alloy), Mg:Al (magnesium aluminum alloy), Au (gold), ITO (Indium tin oxide), $SnO_2$ (tin oxide), ZnO (zinc oxide), FTO (fluorine-doped tin oxide), AZO (aluminum-doped zinc oxide), and the like.

For example, the optical coupling layer 220 plays a role of increasing light output of a general optical coupling layer (CPL). In a case where the transparent electrode layer 211 is made of a metal material, in order to reduce mode loss of SPP (surface plasmon polarition) of the transparent electrode layer 211, and increase transmittance of the transparent electrode layer 211, a refractive index of the optical coupling layer 220 should be selected to be relatively high, for example, the refractive index of the optical coupling layer 220 is greater than 1.8, and the present example includes but is not limited thereto.

For example, the optical coupling layer 220 is a semiconductor layer including an n-type doping material or a p-type doping material. For example, the material of the optical coupling layer 220 provided in the present embodiment may be the same material as the first optical coupling layer provided in the abovementioned embodiments, and details are omitted herein.

Because conductivity of a semiconductor host material of the optical coupling layer 220 can be increased by a doping process, the optical coupling layer provided by the present embodiment has relatively good conductive characteristics, while having an effect of increasing the light output, which can assist the transparent electrode layer in conducting electricity, so as to reduce the IR-drop of the display panel.

For example, because the optical coupling layer 220 provided in the present embodiment has relatively good conductive characteristics and can assist the transparent electrode layer 211 in conducting electricity. Therefore, the transparent electrode layer 211 in the present embodiment can have a small thickness, for example, the transparent electrode layer 211 may have a thickness of 90 to 150 Å, so that while the stability of the transparent electrode layer 211 being guaranteed, the transmittance of the transparent electrode layer 211 can be increased, and the color shift can be reduced.

For example, the optical coupling layer 220 has a thickness of 40 to 100 nm in a direction perpendicular to the base substrate 200, and the present embodiment includes but is not limited thereto.

For example, as illustrated by FIG. 3A, the transparent electrode layer 211 is located on the side of the light emitting layer 212 away from the base substrate 200, that is, light emitted from the electroluminescent device does not pass through the base substrate 200 but is emitted from a reverse side of the base substrate 200. Thus, the electroluminescent device has a top emitting structure.

For example, the electroluminescent device further includes an electrode 213, a hole injection layer 217, and a hole transport layer 216 between the light emitting layer 212 and the base substrate 200.

For example, a material of the hole injection layer 217 may include one or more selected from the group consisting of $MoO_3$ (molybdenum trioxide), $V_2O_5$ (vanadium pentoxide), PEDOT:PPS (3,4-ethylenedioxythiophene polymer: polystyrene sulfonate), and the like. The present embodiment includes but is not limited thereto.

For example, the electroluminescent device further includes an electron transport layer 215 between the light emitting layer 212 and the transparent electrode layer 211. For example, a material of the electron transport layer 215 may include materials such as Liq (lithium quinoline), Alq$_3$ (8-hydroxyquinoline aluminum), and the like. The present embodiment includes, but is not limited thereto.

For example, with respect to a conventional type electroluminescent device, the electrode 213 may be an anode, and the transparent electrode layer 211 may be a cathode; with respect to an inverted type electroluminescent device, the electrode 213 may be a cathode, and the transparent electrode layer 211 may be an anode.

For example, an orthographic projection of the optical coupling layer 220 on the base substrate 200 is completely overlapped with an orthographic projection of the transparent electrode layer 211 on the base substrate 200, that is, the optical coupling layer 220 may be a film layer having the same size as the transparent electrode layer 211.

Figure 3B:
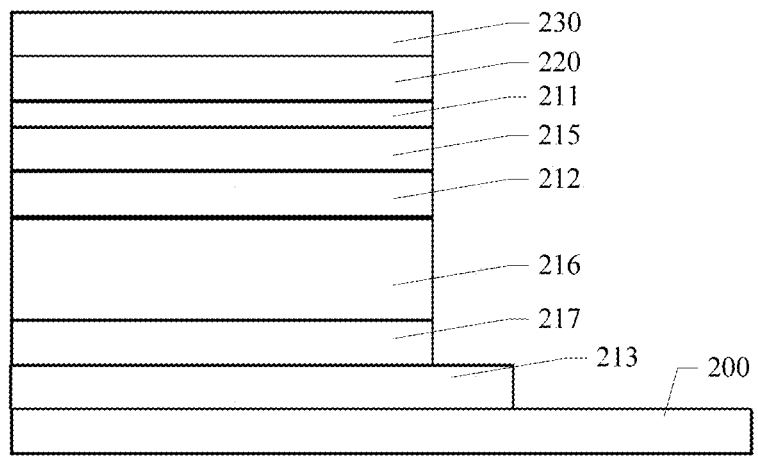
FIG. 3B is a schematic sectional diagram of an electroluminescent device provided by another example of an embodiment of the present disclosure.

For example, FIG. 3B is a schematic sectional diagram of an electroluminescent device provided by another example of an embodiment of the present disclosure. As illustrated by FIG. 3B, the electroluminescent device further includes a second optical coupling layer 230 on a side of the first optical coupling layer 220 away from the transparent electrode layer 211.

For example, a refractive index of the second optical coupling layer 230 is smaller than a refractive index of the first optical coupling layer 220, which may further increase the light output of the electroluminescent device. The second optical coupling layer provided in the present embodiment is a film layer that only plays a role of increasing light output.

Figure 4:
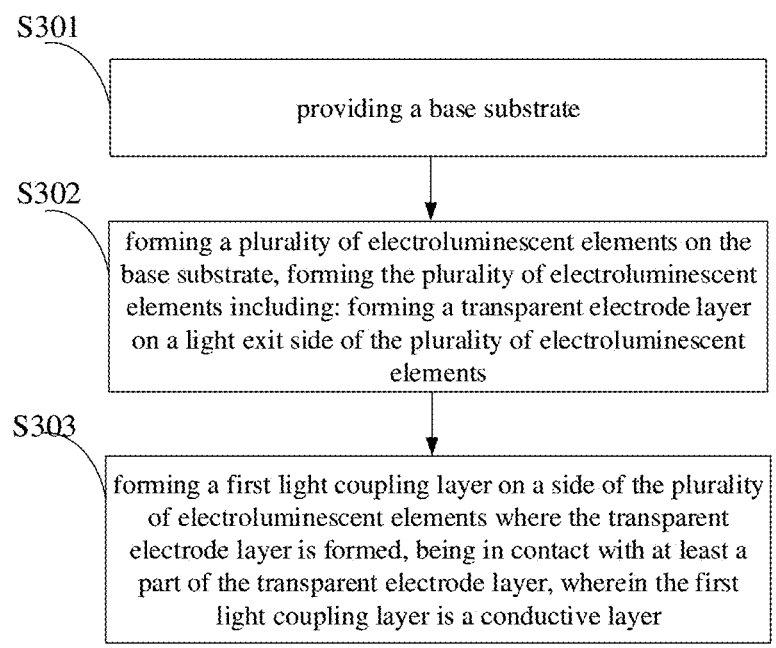
FIG. 4 is an exemplary flow chart of a manufacturing method of a display panel provided by an embodiment of the present disclosure.

Another embodiment of the present disclosure provides a manufacturing method of a display panel, and FIG. 4 is an exemplary flowchart of a manufacturing method of a display panel according to an embodiment of the present disclosure. As illustrated by FIG. 4, the method includes:

S301: providing a base substrate.

For example, the base substrate may be a highly transparent glass, a flexible polymer material layer, a metal foil, or the like, and the base substrate is washed and dried for use. S302: forming a plurality of electroluminescent elements on the base substrate, forming the plurality of electroluminescent elements including: forming a transparent electrode layer on a light exit side of the plurality of electroluminescent elements.

For example, forming the plurality of electroluminescent elements on the base substrate includes: forming a conductive layer on the base substrate. For example, the conductive layer can be formed on the base substrate by chemical vapor deposition, magnetron sputtering, electron beam evaporation, solution spin coating, or the like. The conductive layer is then patterned to form the plurality of electrodes which are spaced apart.

For example, a material of the conductive layer may include any one or more selected from the group consisting of ITO/Ag/ITO (indium tin oxide/silver/indium tin oxide), Au (gold), ITO (indium tin oxide), SnO$_2$ (tin oxide), ZnO (zinc oxide), FTO. A film such as (fluorine-doped tin oxide) and AZO (aluminum-doped zinc oxide). The present embodiment is not limited thereto.

For example, a hole injection layer is formed on a side of the plurality of electrodes which is spaced-apart away from the base substrate, and the hole injection layer completely covers the plurality of electrodes.

For example, a material of the hole injection layer may include a material, such as: MoO$_3$ (molybdenum trioxide), V$_2$O$_5$ (vanadium pentoxide), PEDOT:PPS (3,4-ethylenedioxythiophene polymer: polystyrene sulfonate), and the like.

For example, a hole transport layer may be formed on a side of the hole injection layer away from the base substrate by a vapor deposition or a solution method.

For example, a light emitting layer is formed on a side of the hole transport layer away from the base substrate, and a material of the light emitting layer includes a material, such as: Alq$_3$ (8-hydroxyquinoline aluminum) and DMQA (quinacridone), and the like.

For example, an electron transport layer is formed on a side of the light emitting layer away from the base substrate, and a material of the electron transport layer may include a material, such as: Liq (lithium quinoline), Alq$_3$ (8-hydroxyquinoline aluminum), and the like.

For example, a transparent electrode layer is formed on a side of the electron transport layer away from the base substrate.

For example, an integral layer of a transparent electrode layer can be formed on the electron transport layer by chemical vapor deposition, magnetron sputtering, electron beam evaporation, solution spin coating or the like.

For example, a material of the transparent electrode layer includes any one or more selected from the group consisting of Ag (silver), Al (aluminum), Mg:Ag (magnesium silver alloy), Mg:Al (magnesium aluminum alloy), Au (gold), ITO (indium tin oxide), SnO$_2$ (Tin oxide), ZnO (zinc oxide), FTO (fluorine-doped tin oxide), AZO (aluminum-doped zinc oxide), and the like.

S303: forming a first optical coupling layer on a side of the plurality of electroluminescent elements where the transparent electrode layer is formed, being in contact with at least a part of the transparent electrode layer, wherein the first optical coupling layer is a conductive layer.

For example, forming the first optical coupling layer on the transparent electrode layer includes: evaporating a first host material and one of a first n-type doping material and a first p-type doping material on a side of the transparent electrode layer away from the plurality of electroluminescent elements to form the first optical coupling layer. The first optical coupling layer formed in the present embodiment has relatively good conductive characteristics, while having an effect of increasing the light output, which can assist the transparent electrode layer in conducting electricity, so as to reduce IR-drop of the display panel and increase uniformity of the device.

For example, a material of the first optical coupling layer may include any one or more selected from the group consisting of NPB (N,N'-bis(1-naphthyl)-N,N'-diphenyl-1,1'-diphenyl-4,4'-diamine), TPD (N,N'-bis(3-methylphenyl)-N,N'-diphenyl-1,1'-diphenyl-4,4'-diamine) and Alq$_3$ (8-hydroxyquinoline aluminum), that is, the material of the first optical coupling layer may be the same semiconductor material as the hole transport layer or the electron transport layer, and the present embodiment includes but is not limited thereto.

For example, the first optical coupling layer may use NPD (N,N'-diphenyl-N,N'-(1-naphthyl)-1,1'-biphenyl-4,4'-diamine) as a host material, and use HAT-CN (11-hexacyano-1;12-hexaazatriphenylene) as a doping material to perform a p-type doping to NPD to form the first optical coupling layer having relatively good conductive characteristics.

For example, the present embodiment is not limited to doping HAT-CN, and also can use a p-type dopant, such as: F4TCNQ (2,3,5,6-tetrafluoro-7,7',8,8'-tetracyanoquinone-dimethane), HAT-CN, $MoO_3$ (molybdenum trioxide), $V_2O_5$ (vanadium pentoxide), and $WO_3$ (tungsten trioxide).

For example, the first optical coupling layer may also use Liq (lithium quinoline) as a host material, and use Cs (caesium) as a doping material to perform n-type doping on the Liq to form the first optical coupling layer having relatively good conductive characteristics. For example, the present embodiment is not limited to doping Cs, and may also use an n-type dopant such as: Li (lithium), $Li_2CO_3$ (lithium carbonate), and $Cs_2CO_3$ (cerium carbonate) and the like.

For example, the first optical coupling layer has a thickness of 40-100 nm in a direction perpendicular to the base substrate, and the present embodiment includes but is not limited thereto.

For example, the manufacturing method provided by an example of the embodiment further includes: forming a second optical coupling layer on a side of the first optical coupling layer away from the transparent electrode layer. The second optical coupling layer has a refractive index smaller than that of the first optical coupling layer, so as to further increase light output.

For example, in the present example, forming the second optical coupling layer may include: evaporating a second host material and one of a second n-type doping material and a second p-type doping material on a side of the first optical coupling layer away from the transparent electrode layer to form the second optical coupling layer. And the second optical coupling layer is in contact with a part of the transparent electrode layer.

For example, in the present example, the second optical coupling layer may also be an optical coupling layer which is not subjected to a p-type doping or n-type doping, and only plays a role of increasing light output, thus, the second optical coupling layer does not need to be in contact with the transparent electrode layer.

For example, the manufacturing method provided by another example of the embodiment further includes: forming a second optical coupling layer between the first optical coupling layer and the transparent electrode layer. The second optical coupling layer has a refractive index greater than that of the first optical coupling layer, so as to further increase light output.

For example, in this example, the second optical coupling layer may be a semiconductor layer including a second n-type doping material or a second p-type doping material, or may be an optical coupling layer which is not subjected to a p-type doping or n-type doping, and only plays a role of increasing the light output. The present embodiment is not limited thereto.

For example, after the first optical coupling layer is completed or two optical coupling layers are completed, the device may be packaged in an ultraviolet package or a frit package. Another embodiment of the present disclosure provides a display device including the display panel provided by any one of the abovementioned embodiments. The display device can be any product or component having a display function, such as a mobile phone, a tablet computer, a television, a display, a notebook computer, a digital photo frame, a navigator, and the like.

The first optical coupling layer included in the display device has relatively good conductive characteristics, can assist the transparent electrode layer in conducting electricity, so as to reduce the thickness of the transparent electrode layer, and reduce IR-drop in the display device, and increase the uniformity of the device.

The following points should to be explained:

(1) Unless otherwise defined, the same reference numerals are used to refer to the same meaning.

(2) The drawings of at least one embodiment of the present disclosure only relate to the structure in the embodiment of the present disclosure, and other structures may be referenced to the usual design.

(3) For the sake of clarity, layers or regions are enlarged in the drawings for describing embodiments of the present disclosure. It will be understood that when an element such as a layer, a film, a region or a substrate is referred to as being "on" or "under" another element, the element can be "directly" "on" or "under" the another element, or there may be intermediate elements.

The foregoing is only detailed embodiments of the present disclosure, however the scope of the present disclosure is not limited thereto, variations or replacements that easily occur to any one skilled in the art within the technical scope disclosed by the present disclosure should fall within the scope of the present disclosure. Therefore, the scope of the present disclosure should be based on the scope of the claims.

What is claimed is:

1. A display panel comprising:
    a base substrate;
    a plurality of electroluminescent elements on the base substrate, each of the plurality of electroluminescent elements comprising a light emitting layer and a transparent electrode layer on a light exit side of the light emitting layer; and
    a first optical coupling layer on a side of the plurality of electroluminescent elements where the transparent electrode layer is located, and being coupled to at least a part of the transparent electrode layer,
    wherein the first optical coupling layer is conductive,
    wherein the first optical coupling layer is a semiconductor layer comprising a first n-type doping material or a first p-type doping material.

2. The display panel according to claim 1, wherein the transparent electrode layer has a thickness of about 90 to 150 Å.

3. The display panel according to claim 1, wherein the first optical coupling layer is located on a side of the plurality of electroluminescent elements away from the base substrate.

4. The display panel according to claim 1, wherein the plurality of electroluminescent elements are arranged in an array, and the first optical coupling layer is an integral layer covering the plurality of electroluminescent elements.

5. The display panel according to claim 1, further comprising:
    a second optical coupling layer on a side of the first optical coupling layer away from the transparent electrode layer,
    wherein a refractive index of the second optical coupling layer is smaller than a refractive index of the first optical coupling layer.

6. The display panel according to claim 5, wherein the second optical coupling layer is a semiconductor layer comprising a second n-type doping material or a second p-type doping material, and is in contact with a part of the transparent electrode layer.

7. The display panel according to claim 6, wherein an orthographic projection of the first optical coupling layer on the base substrate falls into an orthographic projection of the second optical coupling layer on the base substrate, and the second optical coupling layer is in contact with a part of the transparent electrode layer which is not covered by the first optical coupling layer.

8. The display panel according to claim 1, further comprising:
a second optical coupling layer between the first optical coupling layer and the transparent electrode layer, wherein a refractive index of the second optical coupling layer is greater than a refractive index of the first optical coupling layer.

9. The display panel according to claim 8, wherein an orthographic projection of the second optical coupling layer on the base substrate falls into an orthographic projection of the first optical coupling layer on the base substrate, and the first optical coupling layer is in contact with a part of the transparent electrode layer which is not covered by the second optical coupling layer.

10. A display device, comprising the display panel according to claim 1.

11. The display panel according to claim 1, further comprising:
a transparent buffer layer, provided between the first optical coupling layer and air, the transparent buffer layer has a refractive index between that of the first optical coupling layer and that of the air.

12. The display panel according to claim 1, wherein the plurality of electroluminescent elements are arranged in an array, and the first optical coupling layer only covers a light emitting region of the plurality of electroluminescent elements.

13. An electroluminescent device, comprising:
a base substrate;
a light emitting layer on the base substrate;
a transparent electrode layer on a light exit side of the light emitting layer; and
an optical coupling layer on a side of the transparent electrode layer away from the light emitting layer, and being coupled to the transparent electrode layer,
wherein the optical coupling layer is conductive,
wherein the first optical coupling layer is a semiconductor layer comprising a first n-type doping material or a first p-type doping material.

14. A manufacturing method of the display panel according to claim 1, comprising:
providing the base substrate;
forming the plurality of electroluminescent elements on the base substrate, forming the plurality of electroluminescent elements comprising: forming the light emitting layer on the base substrate, and forming the transparent electrode layer on the light exit side of the light emitting layer; and
forming the first optical coupling layer on a side of the plurality of electroluminescent elements where the transparent electrode layer is formed, the first optical coupling layer being coupled to at least a part of the transparent electrode layer,
wherein the first optical coupling layer is conductive,
wherein forming the first optical coupling layer comprises:
evaporating a first host material and one of a first n-type doping material and a first p-type doping material on a side of the transparent electrode layer away from the plurality of electroluminescent elements to form the first optical coupling layer.

15. The manufacturing method of the display panel according to claim 14, further comprising:
forming a second optical coupling layer on a side of the first optical coupling layer away from the transparent electrode layer, wherein a refractive index of the second optical coupling layer is smaller than a refractive index of the first optical coupling layer.

16. The manufacturing method of the display panel according to claim 15, wherein forming the second optical coupling layer comprises:
evaporating a second host material and one of a second n-type doping material and a second p-type doping material on a side of the first optical coupling layer away from the transparent electrode layer to form the second optical coupling layer, wherein the second optical coupling layer is in contact with a part of the transparent electrode layer.

17. The manufacturing method of the display panel according to claim 14, wherein before forming the first optical coupling layer, the manufacturing method further comprises:
forming a second optical coupling layer on a side of the transparent electrode layer away from the plurality of electroluminescent elements, wherein a refractive index of the second optical coupling layer is greater than a refractive index of the first optical coupling layer.

18. A display substrate comprising:
a base substrate;
a plurality of electroluminescent elements on the base substrate, each of the plurality of electroluminescent elements comprising a light emitting layer and a transparent electrode layer on a light exit side of the light emitting layer; and
a first optical coupling layer on a side of the plurality of electroluminescent elements where the transparent electrode layer is located, and being coupled to at least a part of the transparent electrode layer,
wherein the first optical coupling layer is conductive,
wherein the first optical coupling layer is a semiconductor layer comprising a first n-type doping material or a first p-type doping material.

* * * * *